United States Patent [19]

Inoue

[11] Patent Number: 5,130,938
[45] Date of Patent: Jul. 14, 1992

[54] DEVICE AND METHOD FOR FILTERING WEIGHT INDICATIVE SIGNAL FROM WEIGHING DEVICE

[75] Inventor: Shinichi Inoue, Kobe, Japan

[73] Assignee: Yamato Scale Company, Limited, Akashi, Japan

[21] Appl. No.: 435,559

[22] Filed: Nov. 13, 1989

[51] Int. Cl.[5] .................. G01G 23/00; G06F 15/31
[52] U.S. Cl. .................................. 364/567; 364/572;
364/724.01; 177/185
[58] Field of Search ............ 364/567, 572, 574, 575,
364/724.01, 724.07, 724.16, 724.17; 177/185

[56] References Cited

U.S. PATENT DOCUMENTS

| 4,188,667 | 2/1980 | Graupe et al. | 364/724.17 |
|---|---|---|---|
| 4,379,495 | 4/1983 | Cocks et al. | 364/575 |
| 4,624,331 | 11/1986 | Naito | 177/185 |
| 4,705,126 | 11/1987 | Naito | 177/185 |
| 4,789,953 | 12/1988 | Gerrath | 364/724.01 |
| 4,817,026 | 3/1989 | Inoue et al. | 364/724.01 |
| 4,825,965 | 5/1989 | Inoue et al. | 177/185 |
| 4,922,530 | 5/1990 | Kenney et al. | 364/724.16 |
| 4,951,763 | 8/1990 | Zimmerman et al. | 177/185 X |

FOREIGN PATENT DOCUMENTS 578181 10/1988 Australia .
S62-280625 12/1987 Japan .

Primary Examiner—Joseph L. Dixon
Attorney, Agent, or Firm—Senniger, Powers, Leavitt & Roedel

[57] ABSTRACT

A digital filter for filtering a weight indicative signal provided by a weighing device to remove undesirable oscillatory components caused by mechanical vibration of the weighing device. The filter has a plurality of notch frequencies in its transfer characteristic within and/or near the frequency range including such undesirable oscillatory components. The filter utilizes a transfer function of multiplex progressing averages of a series of sample values extracted from the weight signal.

16 Claims, 7 Drawing Sheets

DEVICE AND METHOD FOR FILTERING WEIGHT INDICATIVE SIGNAL FROM WEIGHING DEVICE

BACKGROUND OF INVENTION

This invention relates to a device and a method for filtering a weight indicative electric signal (hereinunder referred to as "weight signal") to remove undesirable components therefrom. More specifically, this invention relates to a device and a method for enabling removal of oscillatory components attributable to external forced vibration from the ground or floor in addition to conventional undampered inherent oscillatory components attributitable to the structure of the weigher.

The weight signal produced from a weighing device such as a strain gauge load cell or force balance generally includes various undesirable components attributable to inherent vibration of the device, loading shock and the like in addition to a d.c. component indicative of the true weight of product to be weighed. The frequency characteristic of such weigher has a shape as shown in FIG. 1(a) and a peak frequency indicative of a feature of the inherent vibration is a frequency band 1 the in unloaded condition, while it is shifted to a lower frequency band 2 in loaded condition. In order to remove these undesirable components, therefore, three frequency ranges a, b and c may be provided as shown with reference to this frequency distribution to filter the weight signal by a filtering device having a frequency-versus-attenuation characteristic as shown in FIG.1(b). A skillful filtering system which enables this proceeding has been disclosed in the Japanese patent opening gazette No. 62-280625 and the Australian patent No. 578,181 of the same applicant as this application and the U.S. Pat. No. 4,817,026 assigned to this applicant. In this system, as shown in FIG. 2, an analog weight signal from a weigher 3 is amplified by an amplifier 4, filtered by an analog filter 5 and then supplied to a sample-and-hold circuit 6 to be sampled therein at a predetermined sampling frequency. A series of sampled weight signal output are digitized by an analog-to-digital (A/D) converter 7 and supplied to an arithmetic circuit 8. The analog filter 5 is adapted to previously remove noises relating to the sampling frequency (above a half of the sampling frequency). The following operation is applied to a series of input digital weight values $D_1$, $D_2$, $D_3$, ... in the arithmetic circuit 8.

As shown in FIG. 3, the successive weight values $D_1$ to $D_{n1}$ ($D_1$ to $D_{10}$ in FIG. 3) are averaged and the resultant average is indicated as $_1M_1$. Next, the successive weight values $D_2$ to $D_{n1+1}$ ($D_2$ to $D_{11}$ in FIG. 3) are averaged and the resultant average is indicated as $_1M_2$. A similar averaging operation is repeated to obtain a time-series of averages $_1M_1$, $_1M_2$, $_1M_3$, ... as shown in FIG. 3. Such series of averages are referred to as "moving (or progressive) averages of the first order" and the number $n_1$ (10 in FIG. 3) is referred to as their "averaging number". Next, the successive averages $_1M_1$ to $_1Mn_2$ ($_1M_1$ to $_1M_{11}$ in FIG. 3), $_1M_2$ to $_1M_{n2+1}$ ($_1M_2$ to $_1M_{12}$ in FIG. 3) and so on are sequentially averaged to obtain a second time-series of averages $_2M_1$, $_2M_2$, $_2M_3$, ... as shown. This series of averages are referred to as "moving (or progressive) averages of the second order" and the number $n_2$ (11 in FIG. 3) is referred to as their "averaging number". By repeating a similar operation, moving averages $_rM_i$ ($i=1,2,3,...$) of r-th order having the averaging number $n_r$ can be calculated successively. Such operation is referred to as "multiplexing of moving (or progressive) averages".

As well known in the field of digital filters, the transfer function of the moving averages of the first order is expressed by the following equation.

$$G(j\omega) = \frac{\text{Sin}\left(\frac{1}{2} n_1 \omega T\right)}{n_1 \text{Sin}\left(\frac{1}{2} \omega T\right)} e^{-j\omega \frac{n_1-1}{2} T} \quad (1)$$

The former part of this equation is representative of the amplitude characteristic and the latter exponential part thereof is representative of the phase delay. In the equation (1), T denotes the sampling interval or period and $\omega$ equals $2\pi f$, where f denotes the oscillation frequency. The amplitude characteristic is therefore rewritten as follows, $$|G| = \frac{\text{Sin}(n_1 \pi Tf)}{n_1 \text{Sin}(\pi Tf)} = \frac{\text{Sin}\phi}{n_1 \text{Sin}(\phi/n_1)} \quad (2)$$

where $\phi = n_1 \pi Tf$.

Accordingly, the amplitude becomes zero and when $\phi$ equals $N\pi$, where N is a positive integer excluding zero. Therefore, if $f_{n1} = 1/n_1 T$, the zero amplitude occurs at frequencies $Nf_{n1}$. This feature is shown in FIG. 4 where the averaging number is assumed as ten (10). The frequencies $Nf_{n1}$ (N=1,2,...) are referred to as "notch frequencies". Thus, it is understood that the moving average operation executed by the arithmetic circuit 8 functions as a filter having an attenuation band above about a half of frequency $f_{n1}$ and notch frequencies representative of the zero amplitude appearing at integral multiples of $f_{n1}$.

Similarly, the amplitude characteristic of the moving averages of the third order is expressed by the following equation.

$$|G| = \frac{1}{n_1 n_2 n_3} \frac{\text{Sin}(\pi n_1 Tf)\text{Sin}(\pi n_2 Tf)\text{Sin}(\pi n_3 Tf)}{\text{Sin}^3(\pi Tf)} \quad (3)$$

This characteristic is shown in FIG. 5 where $n_1=10$, $n_2=11$ and $n_3=12$. In the drawing, the three notches of $f_{n3}$, $f_{n2}$ and $f_{n1}$ exhibiting attenuation above 70 dB correspond to the frequency range b of FIGS. 1(a) and (b) and the range above 20 Hz exhibiting attenuation of at least about 40 dB corresponds to the frequency range c. The attenuation degrades with decrease of the frequency in the transition range below 16Hz corresponding to the frequency range a. As described above, the resonance components of inherent vibration of the weigher and various undesirable components attributable to shock and the like including frequency components above the intermediate portion of the range a can be filtered out substantially completely by suitably selecting the order number r and the averaging number $n_1$, $n_2$, ... in accordance with the above-cited prior art system.

The object of removal in the prior art is the inherent oscillatory components within the frequency range of about 20 Hz to 50 Hz which is attributable to the structure of the weighing device itself, while this frequency range was thereafter found to be better revised as 15 Hz to 50 Hz. However, it has been found that, in a highly accurate and sensitive weighing device, especially, in case of using a weighing unit having a relatively large tare mass, some of the oscillatory components attributable to external forced vibration acting on the device from the ground or floor have very low frequencies, such as 3 to 8 Hz. Such components may be insufficiently filtered which causes a problem when they are too much. While the strength of such oscillatory components of very low frequency necessarily varies with the external condition, addition of a separate filter effective to this frequency range will result in a problem of degradation of signal response and consequent reduction of weighing power of the weigher.

Accordingly, an object of this invention is to provide improved device and method for filtering a weight signal, which enables to change the attenuation in accordance with the external condition to remove the above-mentioned very low frequency components in the frequency region a of FIG. 1(b) as maintaining the frequency band having the attenuation characteristic of the prior art as shown in the same drawing.

SUMMARY OF INVENTION

According to this invention, there is provided a device for filtering a weight signal of a weighing device, having in a first frequency range an attenuation band for attenuating undesirable components including oscillatory components determined by the weighing range of the weighing device or strong resonance components caused by the weighing device and, further, in a second frequency range lower than the first frequency range an oscillatory component attributable to the external vibration. The device comprises means for sampling the weight signal to provide a series of sample signals and arithmetic means for arithmetically processing the sample signals according to a transfer characteristic and the transfer characteristic corresponds to a transfer function of multiplexed moving averages of the sample signals. The arithmetic means includes means for selecting the averaging numbers of the respective orders of the moving averages to provide a plurality of notch frequencies within near the first frequency range and, as a feature of this invention, means for changing the averaging number corresponding to at least one of the orders of the moving averages to produce a plurality i of notch frequencies separate from those in the first frequency range within and near the second frequency range.

The means for changing the averaging number may be a selective input device which, for example, stores several predetermined averaging numbers and reads one of them in accordance with selection of the operator to supply it to the arithmetic means. The arithmetic means may be a computer as disclosed in the above-cited prior art and a digital filter including a variable coefficient multiplier and affecting an operation equivalent to the above-mentioned moving average multiplexing operation. These and other objects and features of this invention will be described in more detail below with reference to the accompanying drawings.

BRIEF DESCRIPTION OF DRAWINGS

In the drawings.

Throughout the drawings, same reference numerals are given to corresponding structural components.

DESCRIPTION OF PREFERRED EMBODIMENTS

Figure 6:
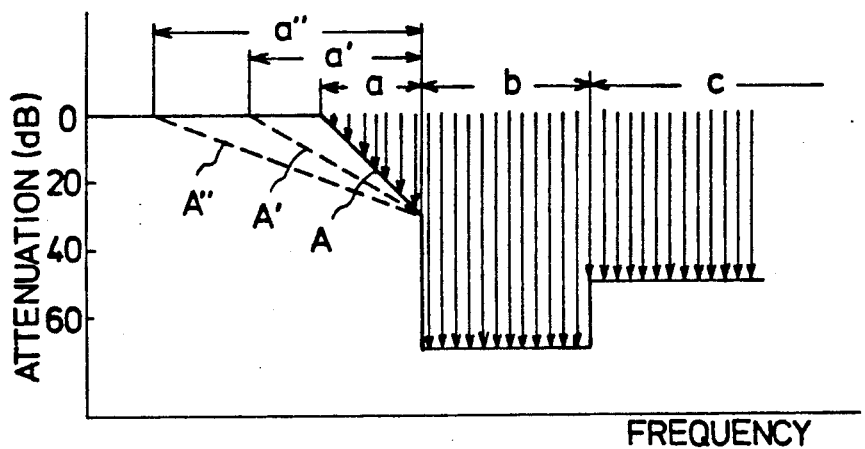
FIG. 6 is an explanatory diagram of the principle of the filtering system according to this invention.
Figure 7:
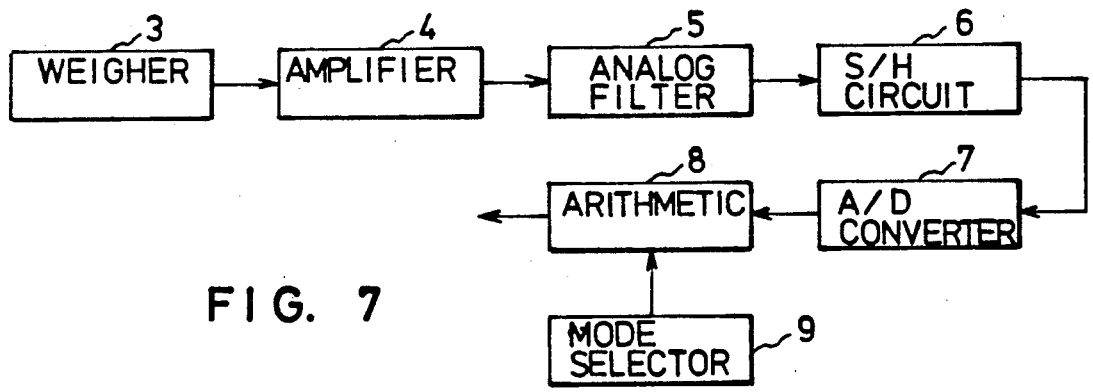
FIG. 7 is a block diagram representing a configuration of the filtering device according to this invention.

The principle of the above-mentioned device of this invention is to selectively change the inclination of the attenuation in the low frequency range a of the filtering characteristic of FIG. 1(b) as shown by A, A' and A"in FIG. 6, thereby expanding the filtering range as shown by a, a' and a"in FIG. 6, while maintaining the attenuation in the higher frequency ranges b and c as shown in FIG. 6. In the device of this invention, therefore, the arithmetic circuit 8 of the prior art device of FIG. 2 is provided with a mode selector device 9 which, is enabled to selectively change the averaging number of the moving average multiplexing operation in at least one of the orders thereof as shown in FIG. 7. In the following embodiments, it is assumed, as an example, that the moving averages of weight samples at a sampling frequency $T=1/155$ second are calculated to the fourth order and that the value of the averaging number $n_1$ of the first order can be specified arbitrarily among four values 14, 21, 28 and 35 and the averaging numbers $n_2$, $n_3$ and $n_4$ of the second, third and fourth orders are fixed to 8, 9 and 10, respectively.

Assuming now that the sample data as $D_1, D_2, \ldots D_i, \ldots$, the moving averages of $n_1$ of them (first order) as $_1M_1, _1M_2, \ldots _1M_i, \ldots$, the moving averages of $n_2$ of them (third order) as $_3M_1, _3M_2, \ldots _3M_i, \ldots$ and the moving averages of $n_4$ of them (fourth order) as $_4M_1, _4M_2, \ldots _4M_i, \ldots$ then, the following relation is obtained among the averages of respective orders:

$$_1M_{i+1} = {_1M_i} + \frac{D_{i+1}}{n_1} - \frac{D_{i-n_1+1}}{n_1} \tag{4a}$$

$$_2M_{i+1} = {_2M_i} + \frac{_1M_{i+1}}{n_2} - \frac{_1M_{i-n_2+1}}{n_2} \tag{4b}$$

-continued $$_3M_{i+1} = {_3M_i} + \frac{_2M_{i+1}}{n_3} - \frac{_2M_{i-n_3+1}}{n_3} \quad (4c)$$

$$_4M_{i+1} = {_4M_i} + \frac{_3M_{i+1}}{n_4} - \frac{_3M_{i-n_4+1}}{n_4} \quad (4d)$$

Figure 8:
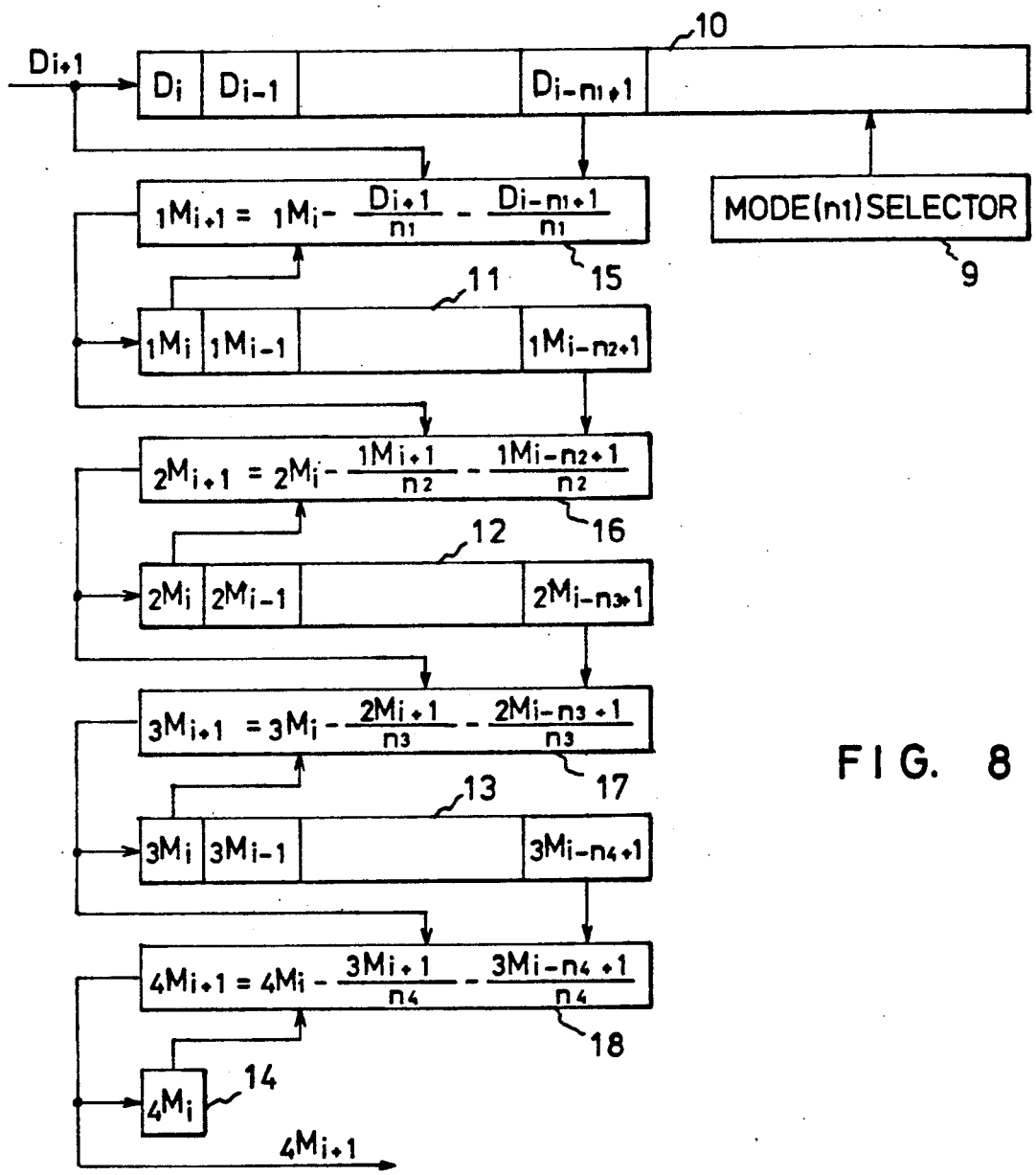
FIG. 8 is a block diagram representing a first embodiment of the filtering device according to this invention.
Figure 11:
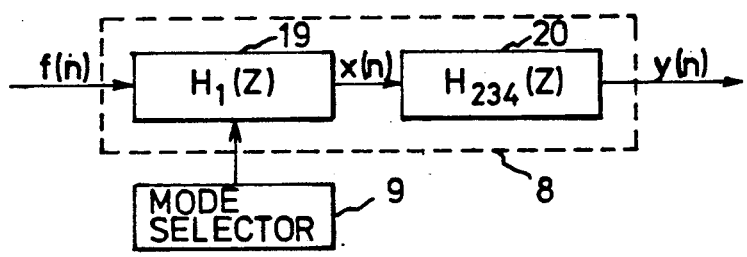
FIG. 11 is a block diagram representing a general configuration of a second embodiment of the filtering device according to this invention.

While the left side of the equation 4d, $_4M_{i+1}$, becomes the filtered output, a configuration of the arithmetic circuit for affecting these operation is shown in FIG. 8. In the drawing, 10, 11, 12 and 13 denotes shift registers having $n_1$, $n_2$, $n_3$ and $n_4$ stages, respectively, and 14 denotes a shift register of a single stage. As $n_1$ is variable as described above, the number of stages of the shift register 10 is made 35, the maximum of $n_1$, and the taps of the 14th, 21st, 28th and 35th stages (generalized by $D_{i-n_1+1}$ in the drawing) can be arbitrarily selected by the mode ($n_1$) selector 9. 15, 16, 17 and 18 denote arithmetic units for affecting the operations of the equations 4a, 4b, 4c and 4d, respectively. A series of sample data $D_{i+1}$ are applied to the first shift register 10 and successively shifted rightwards. Then, the earliest sample data $D_{i-n_1+1}$ is supplied to the arithmetic unit 15 from the specified $n_1$-th stage. The arithmetic unit 15 is also supplied with the current sample data $D_{i+1}$ of the shift register 10 and the output $_1M_i$ of the first stage of the second shift register 11 to calculate the moving averages $_1M_{i+1}$ from these inputs. The calculated moving averages $_1M_{i+1}$ are input to the second shift register 11 as new data. The second arithmetic unit 16 also calculates $_2M_{i+1}$, the moving average of the second order, from $_1M_{i+1}$, the calculated moving average, $_1M_{i-n_2+1}$, the earliest data from the second shift register 11 and $_2M_i$, output of the first stage of the third shift register 12. It is understood that th shift registers for the respective orders and the corresponding arithmetic units repeat thereafter a similar operation and finally calculate $_4M_{i+1}$, the moving average of the fourth order The frequency transfer function H according to the above operation is given by the following equation:

$$H(j\omega) = H_1(j\omega) \times H_{234}(j\omega) \quad (5)$$

where $H_1$ is the frequency transfer function of the moving averages of the averaging number $n_1$ and $H_{234}$ is the frequency transfer function of the moving averages of the third order of the averaging numbers $n_2$, $n_3$ and $n_4$. They are expressed as follows with reference to the equations 1 and 3:

$$H_1 = \frac{1}{n_1} \frac{\sin(\pi n_1 Tf)}{\sin(\pi Tf)} e^{-j\pi Tf(n_1-1)} \quad (6)$$

$$H_{234} = \frac{1}{n_2 n_3 n_4} \frac{\sin(\pi n_2 Tf)\sin(\pi n_3 Tf)\sin(\pi n_4 Tf)}{\sin^3(\pi Tf)} \times \quad (7)$$

$$e^{-j\pi Tf(n_2+n_3+n_4-3)}$$

Figure 9:
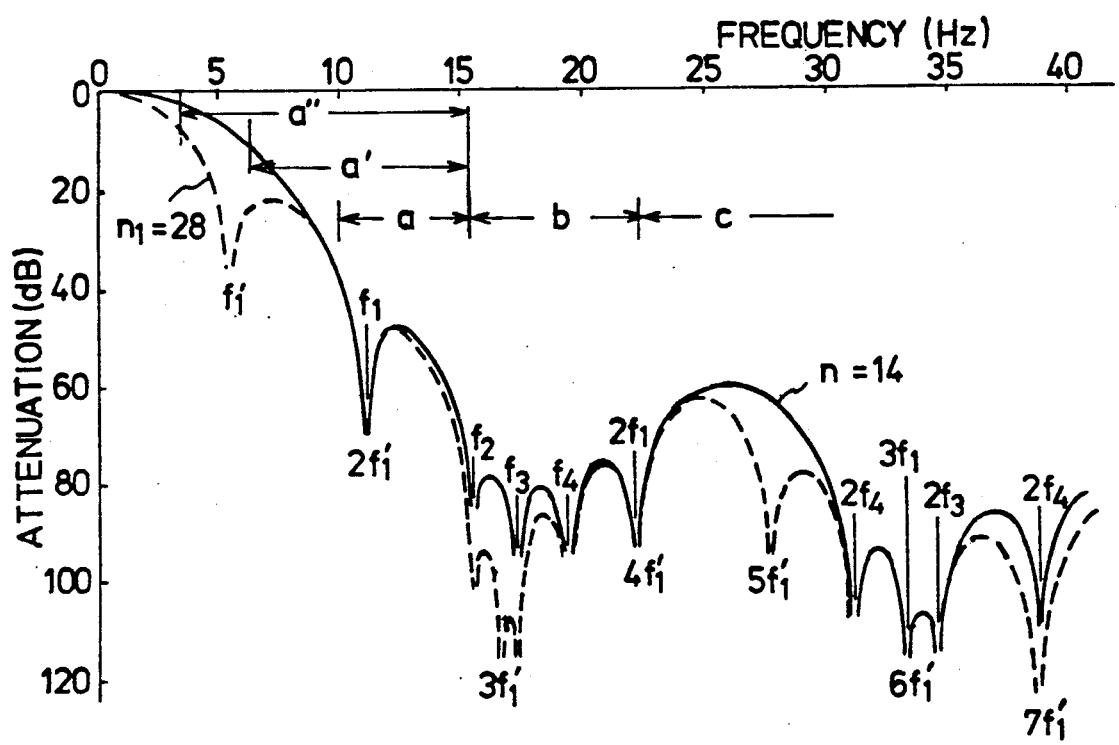
FIGS. 9 and 10 are explanatory diagrams of the filtering characteristic of the filtering device according to this invention.
Figure 10:
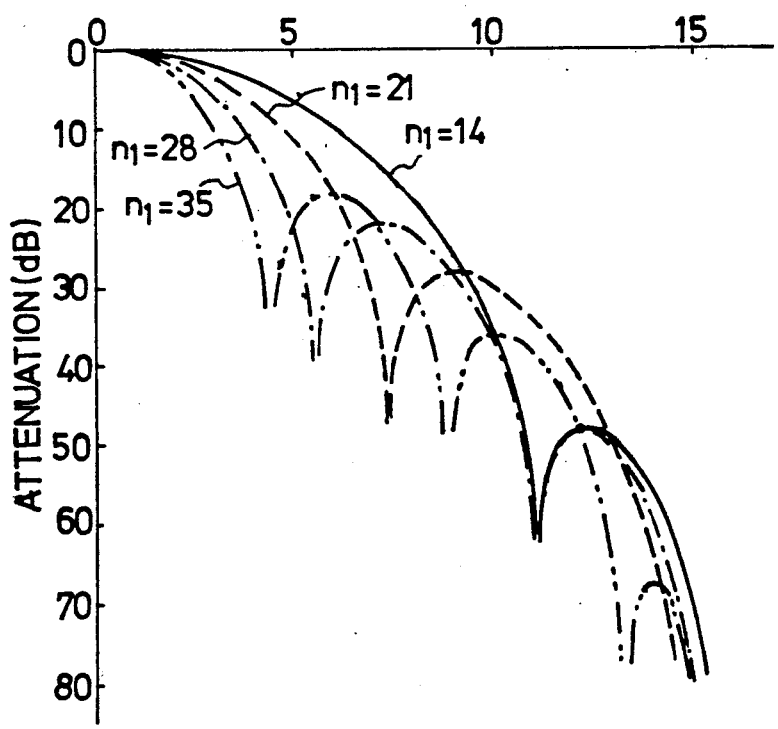

The amplitude characteristic of the above equations H is shown in FIG. 9 where $n_1$ is 14 and 28. As shown in the drawing, a plurality of notch frequencies are produced within the range b. More particularly, the notch frequencies $f_2$, $f_3$ and $f_4$ produced by the averaging numbers $n_2$, $n_3$ and $n_4$ are always fixed regardless of the value of the averaging number $n_1$. In addition, when $n_1 = 14$, one notch frequency $f_1$ appears in the range a and another notch frequency $2f_1$ which is in the second order of $f_1$ appears in the range b. Accordingly, four notch frequencies $2f_1$, $f_2$, $f_3$ and $f_4$ in total appear in the range b. When $n_1 = 28$, a notch frequency $f_1'$ and its second order notch frequency $2f_1'$ appear in the range a and its third and fourth order notch frequencies $3f_1'$ and $4f_1'$ appear in the range b. In this case, therefore, five notch frequencies $3f_1'$, $4f_1'$, $f_2$, $f_3$ and $f_4$ in total appear in the range b, thereby providing the range b with stronger attenuation as compared with the case where $n_1 = 14$. Though not shown in the drawing, two (i.e., first and second order) notch frequencies appear in the range a and one third order notch frequency and three notch frequencies $f_2$, $f_3$ and $f_4$ (i.e., four in total) appear in the range b when $n_1 = 21$, three (i.e., first, second and third order) notch frequencies appear in the range a and three notch frequencies $f_2$, $f_3$ and $f_4$ and two other (i.e., fourth and fifth order) notch frequencies (i.e., five in total) appear in the range b when $n_1 = 35$. In other words, the attenuation in the range b is substantially increased when $n_1 = 21$, 28 or 35 as compared with the case when $n_1 = 14$ in this embodiment, and the increased attenuation is ensured in the range b for all of these averaging numbers. FIG. 10 shows the low frequency region of this frequency characteristic with respect to four values of $n_1$. It is well understood therefrom that t e number of notch frequencies in the low frequency region increases in the valves with increase of $n_1$, thereby increasing the attenuation and expanding the attenuation band toward the much lower frequency region. Even if any of the four values of $n_1$ is selected, the attenuation is maintained above 75.8 dB over 15.5 Hz to 22.14 Hz in the range b and also above 59 dB even in the range c, though the characteristics corresponding to $n_1 = 21$ and $n_1 = 35$ are not shown in FIG. 9. The frequency transfer functions of the equations 5, 6 and 7 can be transformed into time region and expressed in pulse transfer functions as follows:

$$H_1(Z) = \frac{1}{n_1} \frac{(1 - Z^{-n_1})}{(1 - Z^{-1})} \quad (8)$$

$$= \frac{1}{n_1} [1 + Z^{-1} + Z^{-2} + \ldots + Z^{-(n_1-1)}] \quad (8')$$

$$H_{234}(Z) = \frac{1}{n_2 n_3 n_4} \frac{(1 - Z^{-n_2})(1 - Z^{-n_3})(1 - Z^{-n_4})}{(1 - Z^{-1})^3} \quad (9)$$

$$= \frac{1}{n_2 n_3 n_4} [1 + b_1 Z^{-1} + b_2 Z^{-2} + \ldots + \quad (9')$$

$$b_{(n_2+n_3+n_4-3)} Z^{-(n_2+n_3+n_4-3)}$$

$$H(Z) = H_1(Z) \times H_{234}(Z)$$

$$= \frac{1}{n_1 n_2 n_3 n_4} \frac{(1 - Z^{-n_1})(1 - Z^{-n_2})(1 - Z^{-n_3})(1 - Z^{-n_4})}{(1 - Z^{-1})^4} \quad (10')$$

The equation 10 is expanded about Z as follows:

$$H(Z) = \frac{1}{n_1 n_2 n_3 n_4} [1 + b_1' Z^{-1} + b_2' Z^{-2} + \ldots + \quad (10')$$

$$b'_{(n_1+n_2+n_3+n_4-4)} Z^{-(n_1+n_2+n_3+n_4-4)}$$

where $b_1$, $b_2$, ... are weighting coefficients. These equations are equivalent to known finite impulse response (FIR) filters and, therefore, arithmetic operation of each transfer function can be affected substantially by a digital filter. In this case, the decay of response due to multiplexed averaging operation is determined by the number of order of the highest order of Z and the sampling interval T as shown by the equation 1'. It is calculated as follows in this example:

$$(n_1+n_2+n_3+n_4''4)T=(14, 21, 28,$$
$$35+8+9+10-4)/155 = 0.239, 0.284, 0.329 \text{ or}$$
$$0.374 \text{ sec.}$$

Figure 1:
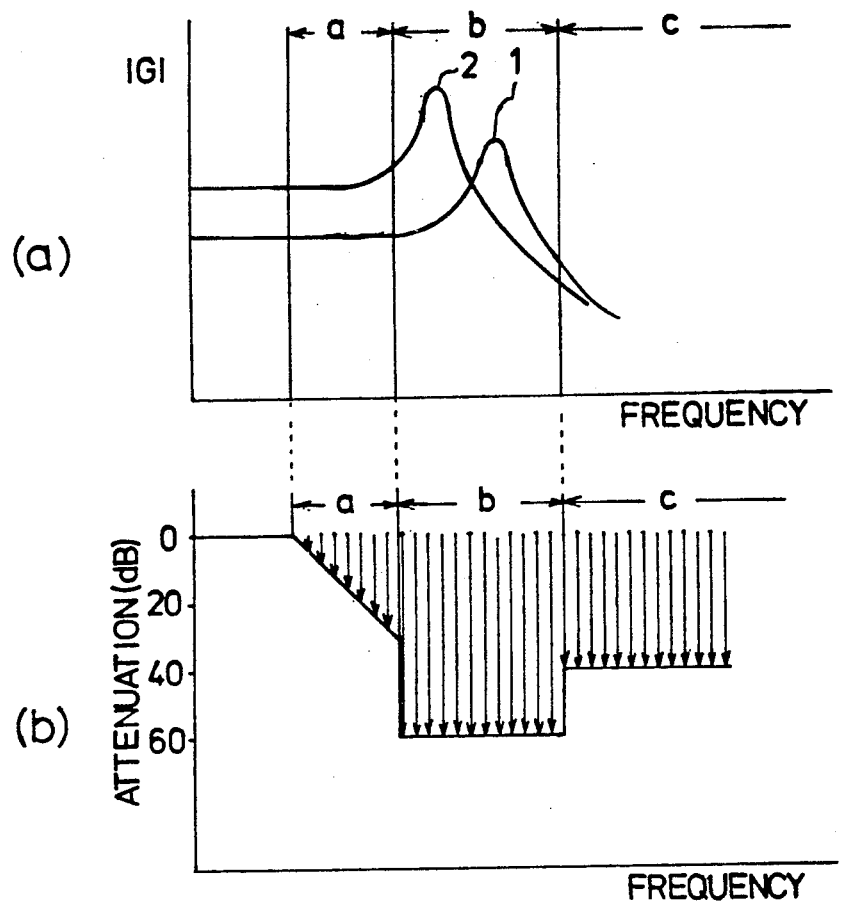
FIGS. 1(a) and (b) are explanatory diagrams of the principle of the prior art filtering system on which this invention is based.
Figure 2:
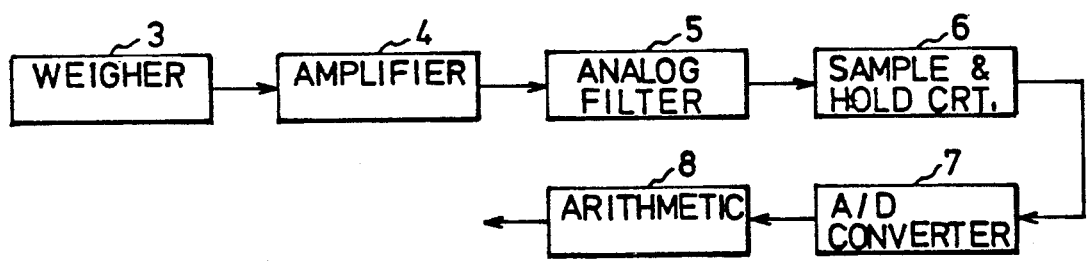
FIG. 2 is a block diagram representing a configuration of the prior art filtering system.
Figure 3:
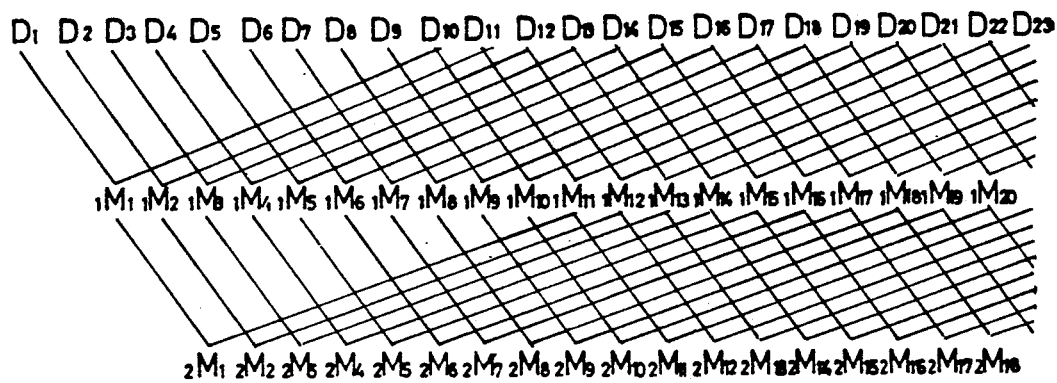
FIG. 3 is a diagram representing a scheme of the moving average multiplexing operation.
Figure 4:
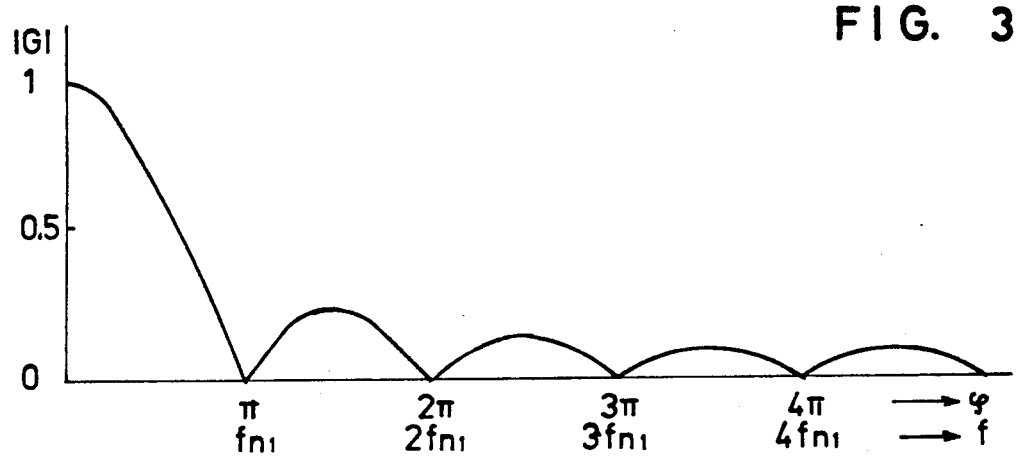
FIG. 4 is a diagram representing an example of the transfer function of moving averages.
Figure 5:
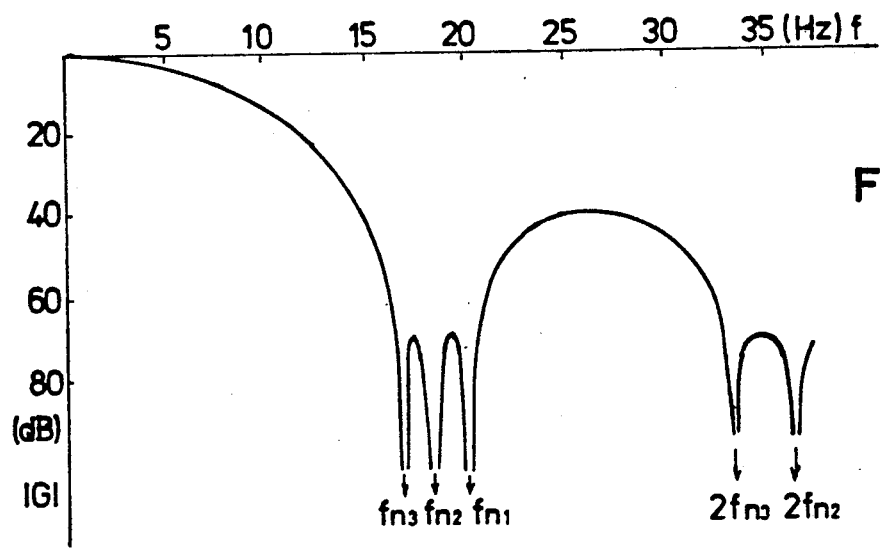
FIG. 5 is a diagram representing an example of the filtering characteristic of the prior art filtering system.

As shown in FIG. 1, the operation of the equation 10 can be realized by constituting the arithmetic circuit 8 of FIG. 7 with an averaging number selectable non-recursive filter 19 for the operation of the equation 8' and an averaging number fixed non-recursive filter 20 for the operation of the equation 9'. Hereinunder, the digital sample input and output of the former stage filter 19 will be expressed respectively as f(n) and x(n) and the filtered output of the latter stage filter 20 will be expressed as y(n).

Figure 12:
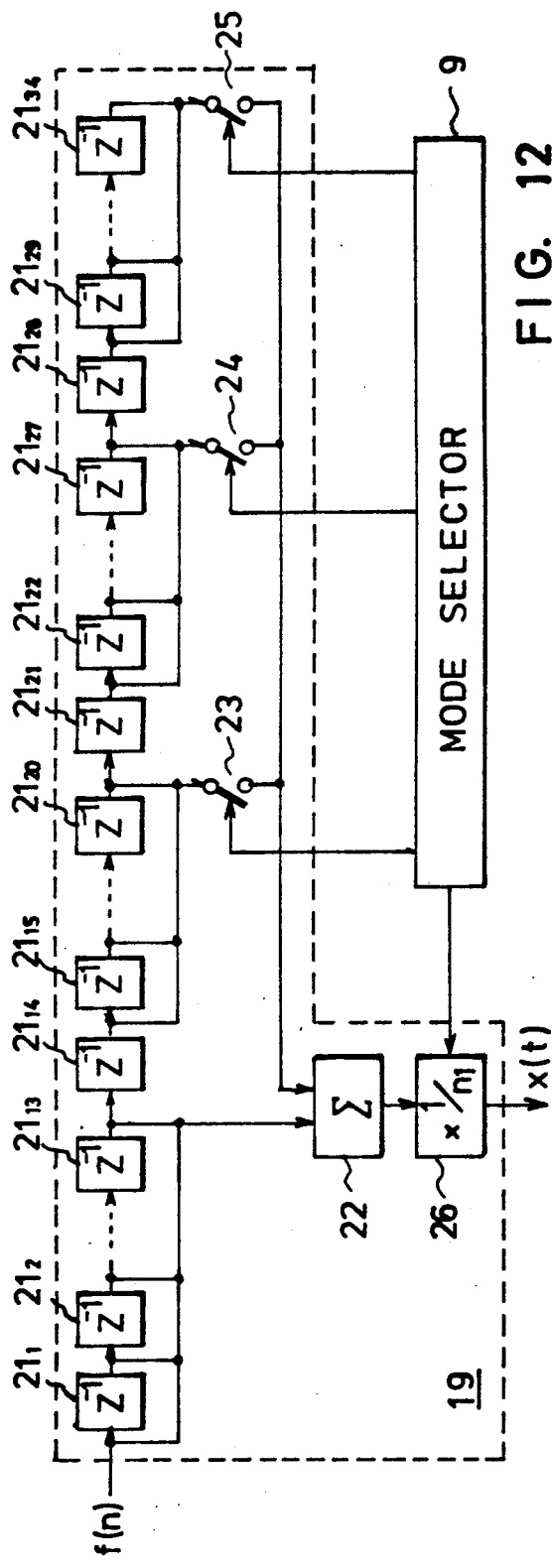
FIGS. 12 and 13 are block diagrams representing circuit configuration of the second embodiment.

FIG. 12 shows an example of the non-recursive filter 19 in the former stage. In this example, thirty four (34) delay elements 21, -2134 are connected in series and respective delayed outputs are supplied to a summer circuit 22 together with the original input P(n) as shown. In this case, the outputs of the fourteenth to twentieth stages, the outputs of the twenty-first to twenty-seventh stages and the outputs of the twenty-eights to thirty-fourth stages are supplied through gates 23, 24 and 25, respectively. The output of the summer 22 is applied to a coefficient multiplier 26 and multiplied by a coefficient equal to $1/n_1$ to complete the operation of the equation 8'. While the coefficient of the coefficient multiplier 26 is selected by the mode selector 9, the selector 9 is adapted also to control the gates 23, 24 and 25 at the same time in accordance with the following Table I. In Table I, the binary code "1" indicates a closed circuit and the binary code "0" indicates an open circuit.

TABLE I

| MODE | n1 | GATE 23 | GATE 24 | GATE 25 |
|------|----|---------|---------|---------|
| 1 | 14 | 0 | 0 | 0 |
| 2 | 21 | 1 | 0 | 0 |
| 3 | 28 | 1 | 1 | 0 |
| 4 | 35 | 1 | 1 | 1 |

By comparing Table I with FIG. 12, it is understood that the arithmetic operation of the equation 8' is adequately executed with each value of $n_1$.

Figure 13:
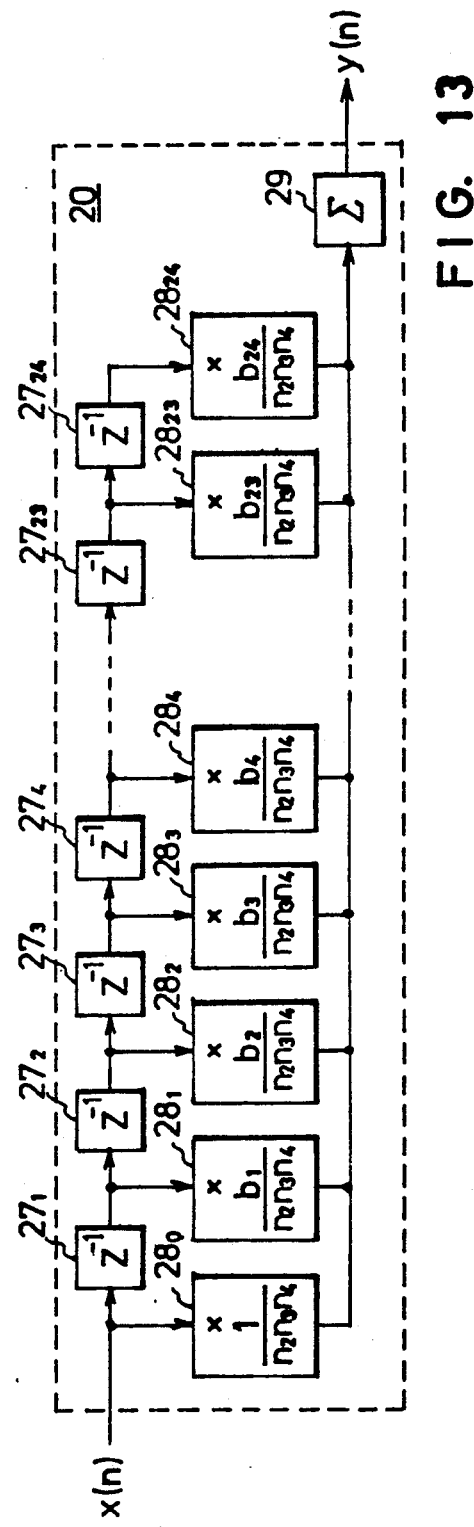

FIG. 13 shows an example of the non-recursive filter 20 in the latter stage. The filter 20 includes twenty four (24) delay elements connected in series and its input and the outputs of the respective stages are supplied to a summer 29 through twenty five (25) coefficient multipliers $28_0, 28_1, \ldots 28_{24}$, respectively, as shown. Each multiplier is adapted to store a coefficient as shown and multiplies thereby its input. It is readily understood that the operation of the equation 9' is affected by this circuit. Thus, the output y(n) of the summer 29 becomes the output of the filtering device of this invention.

Figure 14:
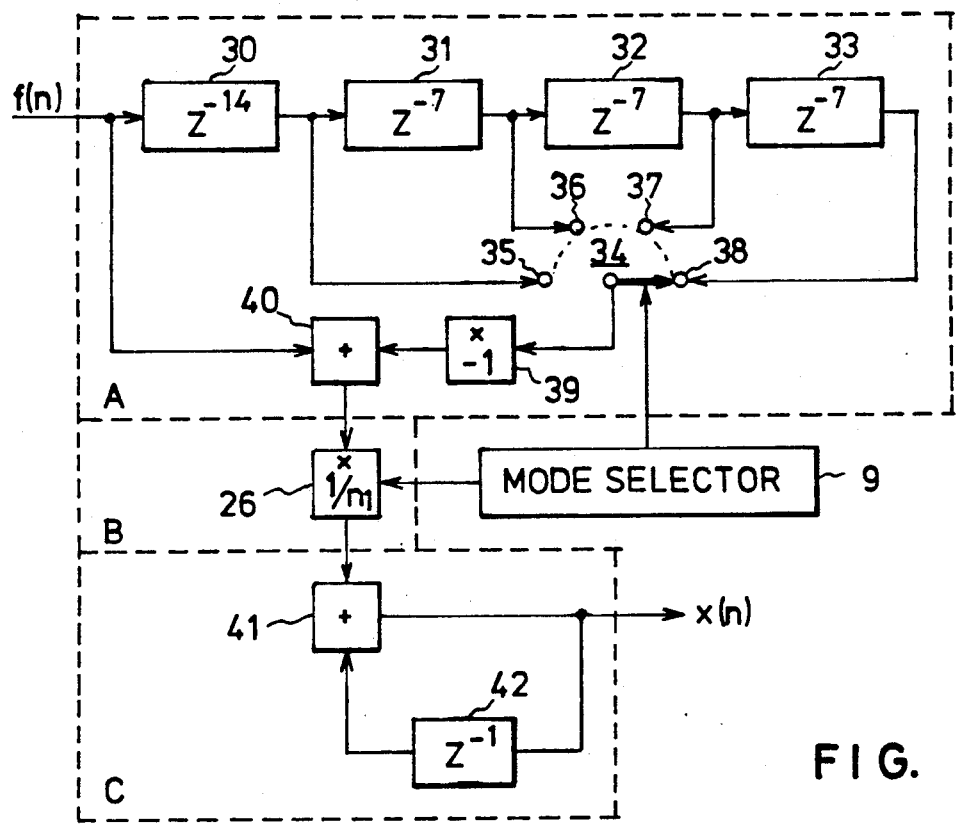
FIG. 14 is a block diagram representing an alternative modification of the circuit of FIG. 12.

A modification of the non-recursive filter 19 of FIG. 12 is shown in FIG. 14. Here, a delay element 30 of the fourteenth order and three delay elements 31, 32 and 33 of the seventh order are connected in series instead of the thirty four delay elements 21 of the first order. The outputs of the respective elements are supplied to an inverter 39 through four terminals 35, 36, 37 and 38 of a switch 34. The inverter 39 is adapted to multiply the input by −1 (to invert its phase) and supplies the result to an adder 40 to add to the original input f(n). A non-recursive filter is constituted with these components. The sum output of the adder 40 is supplied to a coefficient multiplier 26 which is similar to that of FIG. 12 and multiplied by a coefficient equal to $1/n_1$. The mode selector 9 is adapted to change the coefficient 1/n, of the coefficient multiplier 26 by changing the divisor to 14, 21, 28 or 35 and also turn the switch 34 to corresponding one of the terminals 35, 36, 37 and 38 in accordance with the operator's selection. The output of the coefficient multiplier 26 is supplied to a recursive filter composed of an adder 41 and a delay element 42 of the first order. Putting $A=1-Z^{-1}$, $B=1/n_1$ and $C=1/(1-Z^{-1})$ in the equation 8, then H(Z)=ABC and it is understood that three equations of A, B and C are operated respectively by three dashed blocks A, B and C of FIG. 14. It is also understood that the output of the recursive filter C is the filtered output x(n).

Figure 15:
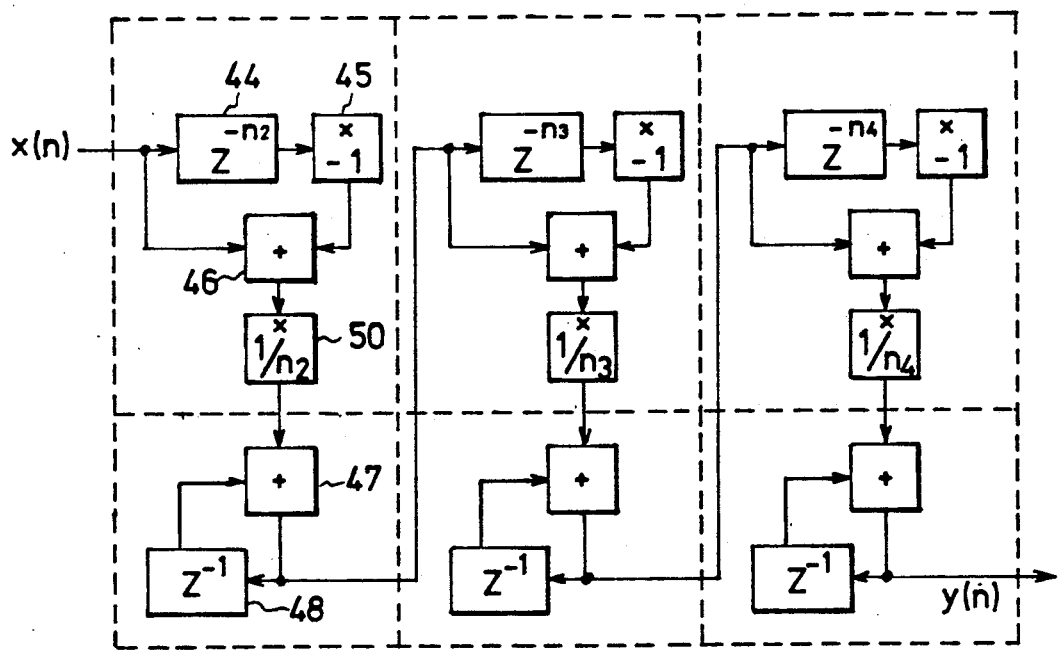
FIG. 15 is a block diagram representing an alter native modification of the circuit of FIG. 13.

Similarly, the equation 9' can be operated by a non-recursive/recursive filter of FIG. 15 instead of the non-recursive filter of FIG. 13. This filter is composed of three blocks of the same configuration and each block consists of a non-recursive section comprising delay element 44 of the $n_2$-th, $n_3$-th or $n_4$-th order, an inverter 45, and an adder 46, a recursive section comprising elements 47 and 48 respectively corresponding to the elements 41 and 42 of FIG. 14 and an intervening coefficient multiplier 50 having a coefficient $1/n_2$, $1/n_3$ or $1/n_4$. It is understood that the operations of the respective blocks correspond respectively to three factors $(1-Z^{-n})/n(1-Z^{-1})$ where n equals $n_2$, $n_3$ and $n_4$.

Putting in the equation 10' as $$n_1+n_2+n_3+n_4-4=m-1 \qquad (11)$$

and $$K_0 = 1/n_1n_2n_3n_4, K_1 = b_1'/n_1n_2n_3n_4, \qquad (12)$$
$$K_2 = b_2'/n_1n_2n_3n_4, \ldots$$
$$K_{m-1} = b'_{(m-1)}/n_1n_2n_3n_4,$$

the equation can be rewritten as follows:

$$H(Z)=K_0+k_1Z^{-1}+K_2Z^{-2}+\ldots +K_{m-1}Z^{-(m-1)} \qquad (13)$$

Figure 16:
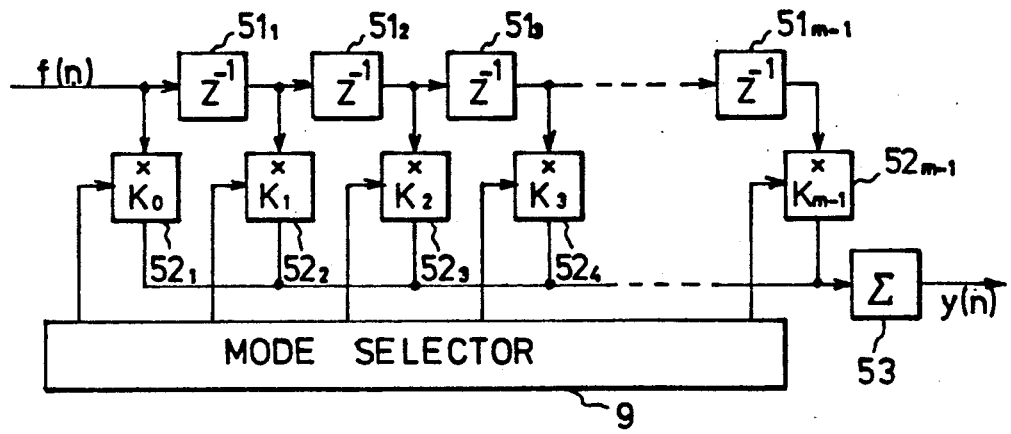
FIG. 16 is a block diagram representing a circuit configuration of a third embodiment of the filtering device according to this invention.

All the coefficients $K_0, K_1, K_2, \ldots$ of the equation 13 can be calculated from the equations 12. FIG. 16 shows a further embodiment of the arithmetic circuit 8 of this invention which is based upon this principle. This device includes m−1 number (58 in this case) of serially connected delay elements 51 of the first order, m number of multipliers for processing the original input and the outputs of the respective delay elements and a summer 53 for summing the outputs of all multipliers 52 and a mode selector 9 is adapted to supply the coefficients $K_0, K_1, K_2, \ldots$ to the respective multipliers 52. The mode selector 9 stores a list of four sets of the K values (the coefficients $K_0, K_1, K_2, \ldots$) previously calculated for each of the $n_1$ values 14, 21, 28 and 35. When the operator specifies the $n_1$ value, supplies the mode selector 4 a corresponding set of K values to the respective multipliers 52. It is apparent that the equation 13 is operated by this device.

The above embodiment have been presented for illustrative purpose only and never mean any limitation of the invention thereto. It is apparent to those skilled in the art that various modifications and variations can be made within the spirit and scope of this invention as defined in the appended claims. For example, while the above embodiments use moving averages to the fourth order and have the averaging number $n_1$ of the first order made variable, it is possible to use moving averages to any order and have the averaging number of any order or orders made variable. For example, it has been found that the attenuation can be further improved in the very low frequency range if the averaging number $n_2$ of the second order is doubled. It is also apparent that an equivalent operation can be affected by a computer or microprocessor instead of the digital filters in the above embodiments. Such operations can be affected also by multiplier/accumulators of Analog Device Co. and the like, for example.

What is claimed is:

1. A device for filtering a weight signal of a weighing device having a weighing range, said weight signal having, in a first frequency range, undesirable components including oscillatory components determined by the weighing range of said weighing device or strong resonance components caused by said weighing device and further having, in a second frequency range lower than said first frequency range, an external oscillatory component attributable to external vibration; said device comprising:
   means for sampling said weight signal to provide a series of sample signals; and
   arithmetic means for arithmetically processing said sample signals according to a transfer characteristic, the transfer characteristic of said arithmetic means corresponding to a transfer function of multiplexed averages of said sample signals, said arithmetic means including means for selecting an average number of the respective orders of the averages to define at least one or more first notch frequencies within or near said first frequency range; and said arithmetic means further including means for changing the averaging number corresponding to at least one of the orders of said averages to define at least one or more second notch frequencies within or near said second frequency range, said arithmetic means processing said sample signals to attenuate the undesirable components including oscillatory components and to attenuate the external oscillatory components having the first and second notch frequencies.

2. A device as set forth in claim 1, wherein said averaging number changing means includes means for specifying any one of a plurality of values averaging number of the of at least one of the orders of said moving averages.

3. A device as set forth in claim 1, wherein the arithmetic means includes a digital filter for producing plural sets of transfer functions equivalent to said multiplexed moving averages.

4. A device as set forth in claim 3, wherein said digital filter is a non-recursive filter.

5. A device as set forth in claim 3, wherein said digital filter is a non-recursive/recursive filter.

6. A device as set forth in claim 1, wherein said arithmetic means includes a first section for affecting an arithmetic operation equivalent to the arithmetic operation of the order of said moving averages whose averaging number is changeable, and a second section for affecting an arithmetic operation equivalent to the arithmetic operation of the order of said moving averages whose averaging number is fixed, and said averaging number selecting means is coupled to said first section.

7. A device as set forth in claim 1, wherein said arithmetic means includes arithmetic operation means using a computer or microprocessor.

8. A device as set forth in claim 2, wherein said arithmetic means includes arithmetic operation means using a computer or microprocessor.

9. A device as set forth in claim 3, wherein said arithmetic means includes arithmetic operation means using a computer or microprocessor.

10. A device as set forth in claim 4, wherein said arithmetic means includes arithmetic operation means using a computer or microprocessor.

11. A device as set forth in claim 5, wherein said arithmetic means includes arithmetic operation means using a computer or microprocessor.

12. A device as set forth in claim 6, wherein said arithmetic means includes arithmetic operation means using a computer or microprocessor.

13. A method of filtering a weight signal of a weighing device having a weighing range, said weight signal having, in a first frequency range, undesirable components including oscillatory components determined by the weighing range of said weighing device or strong resonance components caused by said weighing device; and further having, in a second frequency range lower than said first frequency range, an external oscillatory component attributable to external vibration; said method comprising the steps of:
   sampling said weight signal to provide a series of sample signals;
   arithmetically processing said sample signals to provide a filtered output, said arithmetic processing step including the step of calculating multiplexed averages of said sample signals, said calculating step including the step of selecting an averaging number of each order of said multiplexed averages so that a plurality of first notch frequencies are defined within or near said first frequency range; said calculating step including the step of changing the averaging number corresponding to at least one of the orders of said averages so that at least one or more second notch frequencies are defined within or near said second frequency range, said processing step including attenuating the undesirable components including oscillatory components and attenuating the external oscillatory components having the first and second notch frequencies.

14. A method as set forth in claim 13, wherein said arithmetic processing step includes an operation equivalent to the multiplexed moving averages of said sample signals.

15. A method as set forth in claim 13, wherein said changing step includes the step of optionally specifying said averaging number to be changed from a plurality of predetermined values.

16. A method as set forth in claim 13, wherein said changing step includes a step equivalent to the step of optionally specifying said averaging number to be changes from a plurality of predetermined values.

* * * * *